United States Patent
Kuhnen et al.

(10) Patent No.: US 12,369,493 B2
(45) Date of Patent: Jul. 22, 2025

(54) VIBRONIC MULTISENSOR

(71) Applicant: Endress+Hauser SE+Co. KG, Maulburg (DE)

(72) Inventors: Raphael Kuhnen, Schliengen (DE); Tobias Brengartner, Emmendingen (DE); Sergey Lopatin, Lörrach (DE); Jan Schleiferböck, Rümmingen (DE); Thorsten Springmann, Hausen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 891 days.

(21) Appl. No.: 17/618,657

(22) PCT Filed: May 6, 2020

(86) PCT No.: PCT/EP2020/062523
§ 371 (c)(1),
(2) Date: Dec. 13, 2021

(87) PCT Pub. No.: WO2020/249319
PCT Pub. Date: Dec. 17, 2020

(65) Prior Publication Data
US 2022/0359811 A1 Nov. 10, 2022

(30) Foreign Application Priority Data
Jun. 13, 2019 (DE) .......................... 102019116152.5

(51) Int. Cl.
*H01L 41/113* (2006.01)
*G01F 23/296* (2022.01)
(Continued)

(52) U.S. Cl.
CPC ......... *H10N 30/302* (2023.02); *G01F 23/296* (2013.01); *G01N 9/002* (2013.01); *G01N 2009/006* (2013.01)

(58) Field of Classification Search
CPC ...................................................... H10N 30/302
(Continued)

(56) References Cited

U.S. PATENT DOCUMENTS 6,545,556 B2 * 4/2003 Raffalt ................ G01F 23/2967
331/158
2005/0262944 A1 12/2005 Bennett et al.
2018/0313679 A1 11/2018 Schultheis et al.

FOREIGN PATENT DOCUMENTS

CN 1416522 A 5/2003
CN 101228416 A 7/2008
(Continued)

*Primary Examiner* — Derek J Rosenau
(74) *Attorney, Agent, or Firm* — Christopher R. Powers; Endress+Hauser (USA) Holding, Inc.

(57) ABSTRACT

A device and a method for determining and/or monitoring at least one process variable of a medium include a sensor unit having a mechanically oscillatable unit, at least a first piezoelectric element, a conductivity/capacitance detecting unit for determining and/or monitoring a conductivity and/or capacitance of the medium and an electronics unit. The device is embodied to excite the mechanically oscillatable unit by means of an excitation signal such that mechanical oscillations are executed, to receive the mechanical oscillations of the oscillatable unit, to convert them into a first received signal, to transmit a transmitted signal, and to receive a second received signal. The electronics unit is embodied, based on the first and/or second received signal, to determine the at least one process variable of the medium.

6 Claims, 4 Drawing Sheets

(51) Int. Cl.
*G01N 9/00* (2006.01)
*H10N 30/30* (2023.01)

(58) Field of Classification Search
USPC .......................................... 310/322, 334, 338
See application file for complete search history.

(56) References Cited

FOREIGN PATENT DOCUMENTS

| | | | |
|---|---|---|---|
| CN | 104081171 A | 10/2014 |
| CN | 107250760 A | 10/2017 |
| CN | 109211338 A | 1/2019 |
| DE | 3212434 A1 | 10/1983 |
| DE | 19547915 A1 | 6/1997 |
| DE | 10050299 A1 | 4/2002 |
| DE | 10057974 A1 | 5/2002 |
| DE | 10350084 A1 | 6/2005 |
| DE | 102005015547 A1 | 10/2006 |
| DE | 102006033819 A1 | 1/2008 |
| DE | 102006034105 A1 | 1/2008 |
| DE | 102007013557 A1 | 2/2008 |
| DE | 102006047780 A1 | 4/2008 |
| DE | 102007043811 A1 | 3/2009 |
| DE | 102008043412 A1 | 5/2010 |
| DE | 102009026685 A1 | 12/2010 |
| DE | 102009028022 A1 | 2/2011 |
| DE | 102010030982 A1 | 1/2012 |
| DE | 102011004807 A1 | 8/2012 |
| DE | 102012100728 A1 | 8/2013 |
| DE | 102013102055 A1 | 9/2014 |
| DE | 102013104781 A1 | 11/2014 |
| DE | 102014107927 A1 | 12/2015 |
| DE | 102014114940 A1 | 4/2016 |
| DE | 102015102834 A1 | 9/2016 |
| DE | 102015118123 A1 | 4/2017 |
| DE | 102016112309 A1 | 1/2018 |
| DE | 102016112743 A1 | 1/2018 |
| DE | 102017111393 A1 | 11/2018 |
| DE | 102017130527 A1 | 6/2019 |
| DE | 102018127526 A1 | 5/2020 |
| EP | 0180974 | 5/1986 |
| EP | 0984248 A1 | 3/2000 |
| WO | 2012123344 A1 | 9/2012 |

\* cited by examiner

VIBRONIC MULTISENSOR

CROSS-REFERENCE TO RELATED APPLICATIONS

The present application is related to and claims the priority benefit of German Patent Application No. DE 10 2019 116 152.5, filed on Jun. 13, 2019, and International Patent Application No. PCT/EP2020/062523, filed May 6, 2020, the entire contents of which are incorporated herein by reference.

TECHNICAL FIELD

The invention relates to a device for determining and/or monitoring at least one process variable of a medium, comprising a sensor unit having a mechanically oscillatable unit, at least a first and a second piezoelectric element, a unit for determining and/or monitoring temperature of the medium and an electronics unit. Furthermore, the invention relates to a method for determining and/or monitoring at least one process variable of a medium. The medium is located in a containment, for example, in a container or in a pipeline.

BACKGROUND

Vibronic sensors are widely used in process and/or automation technology. In the case of fill level measuring devices, such have at least one mechanically oscillatable unit, such as, for example, an oscillatory fork, a single tine or a membrane. Such is excited during operation by means of an exciter/receiving unit, frequently in the form of an electromechanical transducer unit, such that mechanical oscillations are executed. The electromechanical transducer unit can be, for example, a piezoelectric drive or an electromagnetic drive. Corresponding field devices are produced by the applicant in great variety and sold, for example, under the marks, LIQUIPHANT and SOLIPHANT. The underpinning measuring principles are known, in principle, from a large number of publications. The exciter/receiving unit excites the mechanically oscillatable unit by means of an electrical excitation signal, such that mechanical oscillations are executed. Conversely, the exciter/receiving unit can receive the mechanical oscillations of the mechanically oscillatable unit and convert them into an electrical, received signal. The exciter/receiving unit is correspondingly either a separate driving unit and a separate receiving unit, or a combined exciter/receiving unit.

In such case, the exciter/receiving unit is in many cases part of a feedback, electrical, oscillatory circuit, by means of which the exciting of the mechanically oscillatable unit occurs, such that mechanical oscillations are executed. For example, for a resonant oscillation, the oscillatory circuit condition must be fulfilled, according to which the amplification factor is and all phases arising in the oscillatory circuit sum to a multiple of 360°. For exciting and fulfilling the oscillatory circuit condition, a certain phase shift between the excitation signal and the received signal must be assured. Therefore, frequently, a predeterminable value for the phase shift, thus, a desired value for the phase shift between the excitation signal and the received signal, is set. For this, the state of the art provides the most varied of solutions, including both analog as well as also digital methods, such as described, for example, in DE102006034105A1, DE102007013557A1, DE102005015547A1, DE102009026685A1, DE102009028022A1, DE102010030982A1 or DE00102010030982A1.

Both the excitation signal as well as also the received signal are characterized by frequency ω, amplitude A and/or phase φ. Correspondingly, changes in these variables are usually taken into consideration for determining the particular process variable. The process variable can be, for example, a fill level, a predetermined fill level, or the density or viscosity of the medium, as well as its flow. In the case of a vibronic limit level switch for liquids, it is distinguished, for example, whether the oscillatable unit is covered by the liquid or freely oscillating. These two states, the free state and the covered state, are distinguished, in such case, for example, based on different resonance frequencies, thus, based on a frequency shift.

The density and/or viscosity can, in turn, only be ascertained with such a measuring device, when the oscillatable unit is covered by the medium. In connection with determining the density and/or viscosity, likewise different options are described in the state of the art, such as, for example, those published in DE10050299A1, DE102007043811A1, DE10057974A1, DE102006033819A1, DE102015102834A1 or DE102016112743A1.

A number of process variables can be determined with a vibronic sensor and used for characterizing a given process. In many cases, however, for a comprehensive process monitoring and/or—control, other information concerning the process, especially knowledge with reference to other physical and/or chemical process variables and/or—parameters, are required. Such can be handled, for example, by integrating other field devices into the process. Then the measured values provided by the different measuring devices can be suitably further processed in a unit superordinated to the devices.

Now, it is, however, the case that the different measuring devices can have, on the one hand, different measurement accuracies. Moreover, drift—and/or aging effects can, in each case, be very different. Such effects can combine to make a given measuring, or process monitoring and/or—control, quite difficult, or inaccurate. Moreover, it can be difficult to detect the conditions of the individual field devices in ongoing operation. Thus, known from German patent application No. 102018127526.9, unpublished as of the earliest filing date of this application, is a vibronic multisensor, by means of which both the vibronic measuring principle as well as also the ultrasonic measuring principle can be applied for determining and/or monitoring one or more process variables.

SUMMARY

Starting from the above-described state of the art, an object of the invention is further to enlarge the functionality of a vibronic sensor.

The object is achieved by the device as well as by the method as defined in the present disclosure.

As regards the device, the object is achieved by a device for determining and/or monitoring at least one process variable of a medium, comprising a sensor unit having a mechanically oscillatable unit, at least a first piezoelectric element, a conductivity/capacitance detecting unit for determining and/or monitoring a conductivity and/or a capacitance of the medium, and an electronics unit. The device is embodied to excite the mechanically oscillatable unit by means of an excitation signal, such that mechanical oscillations are executed, to receive mechanical oscillations of the oscillatable unit and to convert them into a first received signal, to transmit a transmitted signal, and to receive a second received signal. The electronics unit is, in turn, embodied, based on the first and/or second received signal(s), to determine the at least one process variable and, based on a third received signal received from the conductivity/capacitance detecting unit, to determine the conductivity and/or capacitance of the medium.

The mechanically oscillatable unit is, for example, a membrane, a single tine, an arrangement of at least two oscillatory elements, or an oscillatory fork. The at least one piezoelectric element can be arranged, for example, in the region of the oscillatable unit. It serves, on the one hand, as exciter/receiving unit for producing the mechanical oscillations of the mechanically oscillatable unit, which are produced by means of the excitation signal. The mechanical oscillations are, in turn, influenced by the properties of the medium, when the oscillatable unit is covered by medium, such that, based on the first received signal, which represents the oscillations of the oscillatable unit, information is generatable concerning the at least one process variable.

The piezoelectric element serves further for producing a transmitted signal, which is received in the form of the second received signal. When the transmitted signal on its path passes at least at times and sectionally through the medium, it is likewise influenced by the physical and/or chemical properties of the medium and can be taken correspondingly into consideration for determining a process variable of the medium.

Thus, it is possible according to the invention to implement at least two measuring principles in a single device. The sensor unit, on the one hand, executes mechanical oscillations; additionally, a transmitted signal is transmitted. In reaction to the mechanical oscillations and to the transmitted signal, two received signals are received and can be evaluated, for example, as regards at least two different process variables. The two received signals can, in such case, advantageously be evaluated independently of one another. Thus, according to the invention, the number of ascertainable process variables can be significantly increased, this resulting in a higher functionality of the sensor and in a supplemented application domain.

Moreover, the device of the invention includes a conductivity/capacitance detecting unit unit for determining and/or monitoring the conductivity and/or capacitance of the medium. This unit includes, for example, a sensor unit, which is embodied for registering at least one of these two variables. The sensor unit is excited by means of an additional, electrical excitation signal and the third received signal is received from the conductivity/capacitance detecting unit. From the third received signal, then the conductivity and/or capacitance of the medium can be ascertained as at least one other process variable. Because of the additional information concerning conductivity and/or capacitance of the medium, the application domain of the multisensor can accordingly be significantly improved and the functionality of the sensor expanded.

In an advantageous embodiment, the sensor unit includes at least first and second piezoelectric elements, wherein the first and second piezoelectric elements are embodied to excite the mechanically oscillatable unit by means of an excitation signal, such that mechanical oscillations are executed, and to receive mechanical oscillations of the oscillatable unit and to convert them into a first received signal, wherein the first piezoelectric element is embodied to transmit a transmitted signal, and wherein the second piezoelectric element is embodied to receive the transmitted signal in the form of a second received signal. However, more than two piezoelectric elements can be present, which can be arranged at different positions relative to the oscillatable unit.

In an additional advantageous embodiment, the mechanically oscillatable unit is an oscillatory fork having first and second oscillatory elements, wherein the first piezoelectric element is arranged, at least partially, in the first oscillatory element and the second piezoelectric element is arranged, at least partially, in the second oscillatory element. Corresponding embodiments of a sensor unit are described, for example, in DE102012100728A1 as well as in the German patent application No. 102017130527.0 unpublished as of the earliest filing date of this application. Comprehensive reference is taken to these two applications in the context of the present invention. The embodiments of the sensor unit described in these two documents are examples of suitable structural embodiments of the sensor unit. It is, for example, not absolutely necessary to arrange the piezoelectric elements exclusively in the region of the oscillatory elements. Rather, piezoelectric elements can also be arranged in the region of the membrane or in additional oscillatory elements not used for the vibronic excitation, but nevertheless likewise applied on the membrane.

Another embodiment of the device includes that the conductivity/capacitance detecting unit for determining and/or monitoring the conductivity and/or capacitance of the medium comprises a capacitive and/or conductive measuring probe having at least one probe electrode.

The conductive and capacitive measuring principles are sufficiently known from the state of the art. In the case of the conductive measuring principle, for example, it is monitored, whether via the conductive medium an electrical contact is present between a probe electrode and the wall of a conductive container or a second electrode. In the case of the capacitive measuring principle, in contrast, a capacitance of the capacitor formed by a probe electrode and the wall of the container or a second electrode is ascertained.

Known from the state of the art are also multisensors, which are able to perform a conductive and a capacitive measuring, such as described, for example, in DE102011004807A1, DE102013102055A1, DE102014017927A1 or DE102013104781A1.

It is further advantageous that the measuring probe include a guard electrode. The use of a guard electrode serves, for example, for preventing a disturbing influence of accretion in the region of the sensor unit on the measuring and is described at length, for example, in DE3212434C2. Expanding in this connection, described in DE102006047780 A1 is a measuring probe with an amplifying unit and a limiting element, which measuring probe is insensitive to accretion formation over a large measuring range. Additionally, DE102008043412A1 describes a fill level measuring device with a memory unit as subject matter, in which limit values for various media are stored.

Another preferred embodiment of the device includes that the sensor unit comprises a unit for determining and/or monitoring a pressure and/or a unit for determining and/or monitoring a temperature of the medium. Because of the implementing of additional measuring principles in a single sensor, the application range as well as the measuring accuracies of the sensor can be still further broadened and increased.

The object of the invention is achieved, furthermore, by a method for determining and/or monitoring at least one process variable of a medium, wherein a sensor unit is excited by means of an excitation signal, such that mechanical oscillations are executed, the mechanical oscillations are received by the sensor unit and converted into a first received signal, the sensor unit transmits a transmitted signal and receives a second received signal, and, based on the first and/or second received signal, the at least one process variable is ascertained and, based on a third received signal, a conductivity and/or a capacitance of the medium is ascertained.

The method is especially usable for a device according to one of the above described embodiments. It is, on the one hand, an option that the sensor unit operates at the same time by means of the excitation signal and by means of the transmitted signal, wherein the excitation signal and the transmitted signal are superimposed on one another. On the other hand, the sensor unit can, however, also alternate between operation by means of the excitation signal and operation by means of the transmitted signal.

The excitation signal is, for example, an electrical signal having at least one predeterminable frequency, especially a sinusoidal or rectangular electrical signal. Preferably, the mechanically oscillatable unit is excited at least at times to execute resonant oscillations. The mechanical oscillations are influenced by the medium surrounding the oscillatable unit, such that, based on a received signal representing the oscillations, information concerning different properties of the medium can be obtained.

The transmitted signal is preferably an ultrasonic signal, especially a pulsed, ultrasonic signal, especially at least one ultrasonic pulse. Accordingly, performed as second applied measuring method according to the invention is an ultrasonically based measuring method. The transmitted signal passes, at least partially, through the medium and its properties are influenced by the medium. Correspondingly, based on the second received signal, likewise information concerning different media can be obtained.

With the method of the invention, a plurality of different process variables are ascertainable by means of different measuring principles. Different process variables can be advantageously determined independently of one another, such that a comprehensive analysis of a process by means of a single measurement device is enabled. Moreover, because the same sensor unit is used for a plurality of measuring methods, the accuracy of the measurements can be significantly increased. Also, based on the different measuring principles, a condition monitoring of the device can be performed. For such purpose, numerous embodiments for the method of the invention are possible, of which some preferred variants are given below.

A preferred embodiment provides that at least two different process variables are ascertained, wherein a first process variable is ascertained based on the first received signal, and wherein a second process variable is ascertained based on the second received signal.

Another preferred embodiment includes that the at least one process variable is a predeterminable fill level, density, viscosity, velocity of sound or a variable derived from at least one of these variables. Especially preferably, the density of the medium is determined based on the first received signal and the velocity of sound within the medium is determined based on the second received signal. It is understood, however, that, besides the here explicitly mentioned process variables, also other process variables and/or—parameters, which are accessible by means of the two performed measurements, can likewise be determined and taken into consideration for characterizing a particular process.

An embodiment of the method of the invention provides that a reference value for density is ascertained based on the velocity of sound, wherein the reference value is compared by means of a value for density ascertained from the first received signal. Preferably, a concentration of a reference substance dissolved in a reference medium in a specifiable container is ascertained based on the velocity of sound ascertained from the second received signal. From the concentration, then the reference value for density of the reference medium can be ascertained. Additionally, a measured value for density can be ascertained from the first received signal. The two values for density can be compared with one another. Especially, the value for density ascertained from the first received signal can be adjusted based on the reference value for density ascertained from the second received signal. In this way, a disadvantageous influence of the geometry of the utilized containment on the vibronic determining of density can be compensated.

Another preferred embodiment includes that an electrical impedance and/or a dielectric constant of the medium is/are ascertained. The electrical impedance and/or the dielectric constant can be ascertained based on the third received signal. Serving for this is especially a conductivity/capacitance detecting unit for determining and/or monitoring the conductivity and/or capacitance of the medium.

An especially preferred embodiment of the method of the invention provides that at least an electrical conductivity of the medium, the dielectric constant of the medium and/or a degree of coverage of a conductivity/capacitance detecting unit for determining and/or monitoring the conductivity and/or capacitance of the medium are/is recorded as a function of time, wherein, based on the conductivity, the dielectric constant and/or the degree of coverage as a function of time, at least one process transpiring in a containment containing the medium is monitored. The process can be, for example, a mixing process or a cleaning process. In this regard, reference is made to DE102017111393A1, to which comprehensive reference is taken in the context of the present invention, especially to the method described therein.

An especially preferred embodiment includes that a first concentration of a first substance contained in the medium and a second concentration of a second substance contained in the medium are ascertained based on the first and second received signals and/or based on the first and second process variables. In the state of the art for such an analysis of the medium for two different substances, as a rule, two separate measuring devices are required, which provide different measured variables. According to the invention, in contrast, information concerning two different components in a medium can be reliably obtained by means of a single device.

A preferred application of the method concerns monitoring a fermentation process. In a fermentation process, sugar is converted into ethanol. In order to be able to assure a quality monitoring, it is necessary to determine both the concentration of sugar as well as also that of ethanol. Such is possible according to the invention.

Finally, an advantageous embodiment of the method includes that it is ascertained, based on the first and second received signals and/or based on the first and second process variables, whether an accretion has formed on the sensor unit and/or whether a drift and/or aging of the sensor unit is present. The two received signals usually behave differently from one another as a function of an accretion on the probe unit, a drift or an aging in the region of the sensor unit. The presence of an accretion, a drift or an aging can correspondingly be detected, for example, based on a consideration of the two received signals and/or process variables as a function of time.

Advantageously, the first and second received signals, the first and second process variables, and/or the first and second received signals and/or the first and second process variables as a function of time are compared with one another. From the comparison, then the presence of an accretion, a drift or an aging of the sensor unit can be indicated. Since at least two received signals, or process variables, are accessible, a high accuracy as regards the information concerning an accretion, a drift or an aging can be achieved. Because of the implementing according to the invention of two different measurements with a single sensor unit, the presence of accretion, or a drift or an aging of the sensor unit can be reliably detected.

Another preferred embodiment of the method includes that, based on the conductivity, capacitance, electrical impedance and/or dielectric constant of the medium, based on at least one variable derived from at least one of these variables or based on at least one of these variables as a function of time, it is ascertained whether an accretion has formed on the sensor unit and/or whether a drift and/or an aging of the sensor unit is present.

In such case, advantageously, a first information ascertained based on the first and second received signals and/or based on the first and second process variables and a second information ascertained based on the conductivity, capacitance, electrical impedance and/or dielectric constant of the medium, based on at least one variable derived from at least one of these variables and/or based on at least one of these variables as a function of time are compared with one another concerning an accretion on the sensor unit and/or a drift and/or an aging of the sensor unit. In this way, information concerning an accretion, a drift and/or an aging of the sensor unit can be redundantly determined and, in given cases, a plausibility check performed.

Thus, advantageously, based on the comparison, a condition monitoring of at least one component of the sensor unit is performed.

In an additional preferred embodiment, in the case of determining and/or monitoring at least one process variable or in the case of determining a variable derived from at least one process variable and/or at least one received signal, an influence of an accretion, a drift and/or an aging of the sensor unit at least on the first and/or second received signal is reduced or compensated. The influence of an accretion, a drift and/or aging of the sensor unit can, accordingly, be taken into consideration in the case of determining and/or monitoring the particular process variable, such that the process variable can be determined without being affected by the presence of an accretion, a drift and/or aging. For reducing or for compensating the influence, for example, a suitable, especially process dependent, algorithm can be furnished, based on which a value for the particular process variable not corrupted by the influence of the accretion, the drift and/or aging of the sensor unit is ascertainable. Thus, an improved accuracy of measurement can be achieved as well as a method for predictive maintenance provided.

In another preferred embodiment, a thickness and/or a conductivity of an accretion on the sensor unit is ascertained. The thickness and/or the conductivity of the accretion can be ascertained, for example, based on the ascertained conductivity as well as a ratio of a measurement signal of the probe electrode and the guard electrode.

Let it be noted, furthermore, that the embodiments described in connection with the device of the invention can be applied mutatis mutandis also for the method of the invention and vice versa.

BRIEF DESCRIPTION OF THE DRAWINGS

The invention will now be explained in greater detail based on the appended drawing, the figures of which show as follows.

Figure 1:
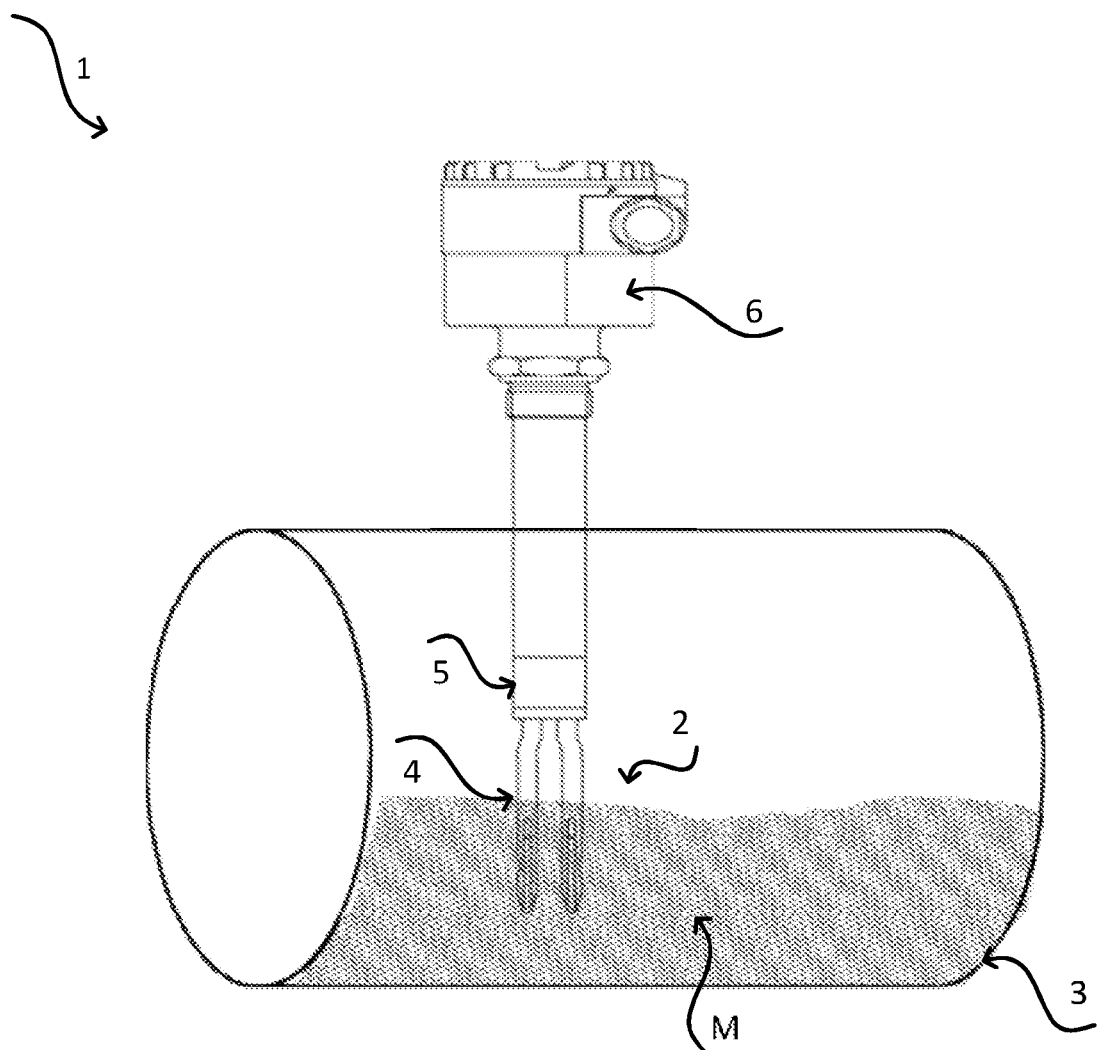
FIG. 1 shows a schematic view of a vibronic sensor according to the state of the art.

In the figures, equal elements are provided with equal reference characters.

DETAILED DESCRIPTION

FIG. 1 shows a vibronic sensor 1 having a sensor unit 2. The sensor has a mechanically oscillatable unit 4 in the form of an oscillatory fork, which is partially immersed in a medium M located in a container 3. The oscillatable unit 4 is excited by means of the exciter/receiving unit 5, such that the oscillatable unit 4 executes mechanical oscillations, and can be, for example, a piezoelectric stack—or bimorph drive. Other vibronic sensors use, for example, electromagnetic exciter/receiving units 5. It is possible to use a single exciter/receiving unit 5, which serves both for exciting the mechanical oscillations as well as also for their detection. Likewise, it is an option to implement a separate driving unit and a separate receiving unit. FIG. 1 shows, furthermore, an electronics unit 6, by means of which signal registration, —evaluation and/or—feeding occurs.

Shown in FIG. 2, by way of example, are different sensor units 2, which are suitable for performing a method of the invention. The mechanically oscillatable unit 4 shown in FIG. 2a includes, applied on a base 8, two oscillatory elements 9a,9b, which are also referred to as fork tines. Optionally, moreover, in each case, paddles (not shown) can be formed at the ends of the two oscillatory elements 9a,9b. Provided in each of the two oscillatory elements 9a,9b is, in each case, an, especially pocket-like, hollow space 10a, 10b, in which, in each case, at least one piezoelectric element 11a, 11b of the exciter/receiving unit 5 is arranged. Preferably, the piezoelectric elements 11a and 11b are cast within the hollow spaces 10a and 10b. The hollow spaces 10a, 10b can, in such case, be so created that the two piezoelectric elements 11a, 11b are located completely or partially in the region of the two oscillatory elements 9a, 9b. Such an arrangement as well as similar arrangements are described at length in DE102012100728A1.

Figure 2A:
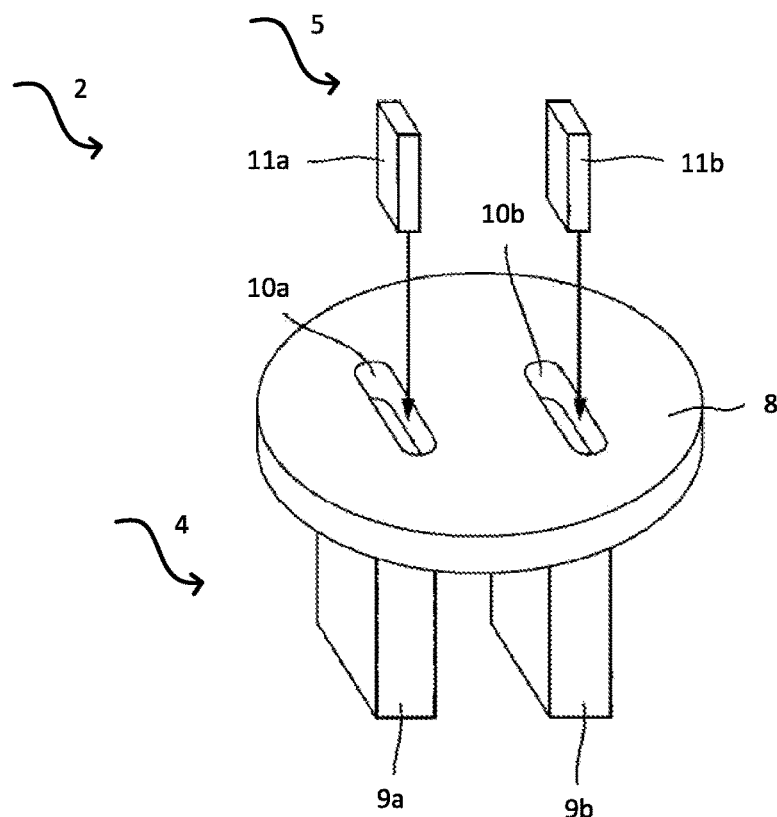
FIGS. 2a-2d show embodiments of a sensor unit suitable for performing the method of the present disclosure.
Figure 2B:
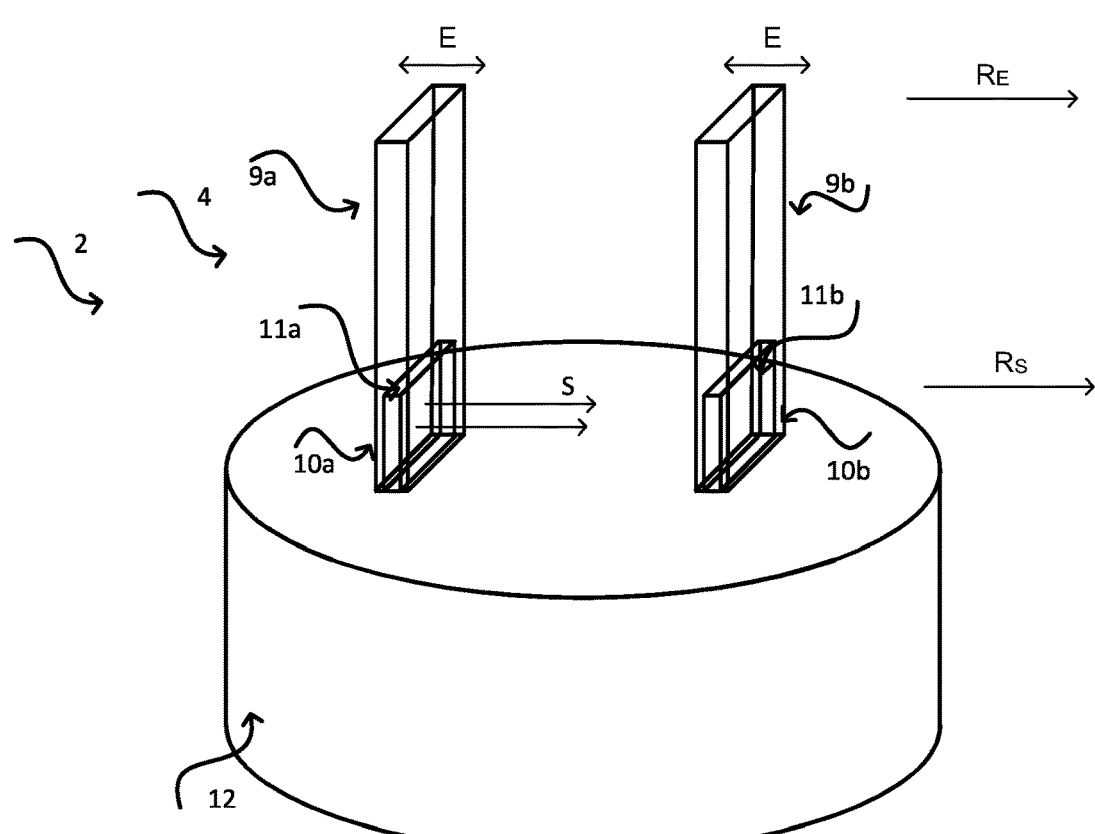

Another example of an embodiment of a sensor unit 2 is shown in FIG. 2b. The mechanically oscillatable unit 4 in such case includes two parallel, rod shaped, oscillatory elements 9a, 9b, which are mounted on a disc shaped element 12 and which can be excited separately from one another to execute mechanical oscillations, and in the case of which the oscillations can likewise be received and evaluated separately from one another. The two oscillatory elements 9a and 9b have, in each case, a hollow space 10a and 10b, into which, in each case, at least one piezoelectric element 11a, 11b is arranged in the region toward the disc shaped element 12. Regarding the embodiment of FIG. 2b, reference is made to DE102017130527A1, which was unpublished as of the earliest filing date of this application.

As shown schematically in FIG. 2b, according to the invention, sensor unit 2 is, on the one hand, supplied with an excitation signal E, in such a manner that the oscillatable unit 4 is excited such that mechanical oscillations are executed. The oscillations are produced, in such case, by means of the two piezoelectric elements 11a and 11b. The two piezoelectric elements can be supplied with the same excitation signal E or the first oscillatory element 11a can be supplied with a first excitation signal $E_1$ and the second oscillatory element 11b with a second excitation signal $E_2$. Likewise, an option is that a first received signal $R_E$ is received based on the mechanical oscillations, or that separate received signals $R_{E1}$, $R_{E2}$ are received by the oscillatory elements 9a,9b.

Moreover, transmitted from the first piezoelectric element 11a is a transmitted signal S, which is received by the second piezoelectric element 11b in the form of a second received signal $R_S$. Since the two piezoelectric elements 11a and 11b are arranged at least in the region of the oscillatory elements 9a and 9b, the transmitted signal S passes through the medium M when the sensor unit 2 is in contact with the medium M and is correspondingly influenced by the properties of the medium M. Preferably, the transmitted signal S is an, especially pulsed, ultrasonic signal, having especially at least one ultrasonic pulse. Likewise, it is, however, also an option that the transmitted signal S from the first piezoelectric element 11a is transmitted in the region of the first oscillatory element 9a and reflected on the second oscillatory element 9b. In such case, the second received signal $R_S$ is received by the first piezoelectric element 11a. The transmitted signal S passes, in this case, twice through the medium M, this leading to a doubling of a travel time $\tau$ of the transmitted signal S Besides these two illustrated embodiments of a device 1 of the invention, numerous other variants are possible, which likewise fall within the scope of the invention. For example, it is possible in the embodiments of FIGS. 2a and 2b to use only one piezoelectric element 11a,11b and to arrange such at least in one of the two oscillatory elements 9a, 9b. In such case, the piezoelectric element 11a serves for producing the excitation signal, and the transmitted signal S, as well as for receiving the first $R_1$ and second received signal $R_2$. The transmitted signal is, in this case, reflected on the second oscillatory element 9b lacking piezoelectric element 11b.

Figure 2C:
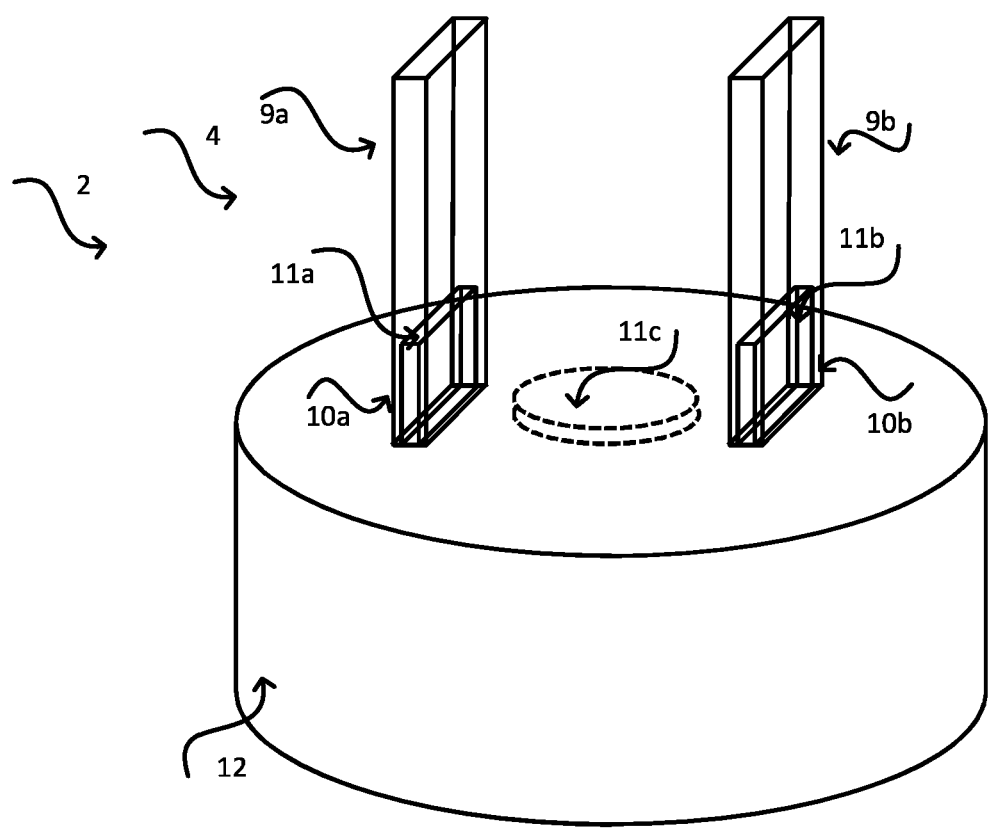

FIG. 2c shows another embodiment, by way of example. In such case, a third piezoelectric element 11c is provided in the region of the membrane 12. The third piezoelectric element 11c serves to produce the excitation signal E and for receiving the first received signal $R_1$, while the first 11a and second piezoelectric element 11b serve to produce the transmitted signal S and to receive the second received signal $R_2$. Alternatively, it is, for example, possible to produce with the first 11a and/or second piezoelectric element 11b the excitation signal E and the transmitted signal S as well as to receive the second received signal $R_2$, wherein the third piezoelectric element 11c serves for receiving the first received signal $R_1$. Likewise, it is possible to produce the transmitted signal S with the first 11a and/or second piezoelectric element 11b and the excitation signal E with the third piezoelectric element 11c and to receive the first $R_1$ and/or second received signal $R_2$ with the first 11a and/or second piezoelectric element 11b. Also in the case of FIG. 2c, it is possible in other embodiments to omit the first 11a or second piezoelectric element 11b.

Figure 2D:
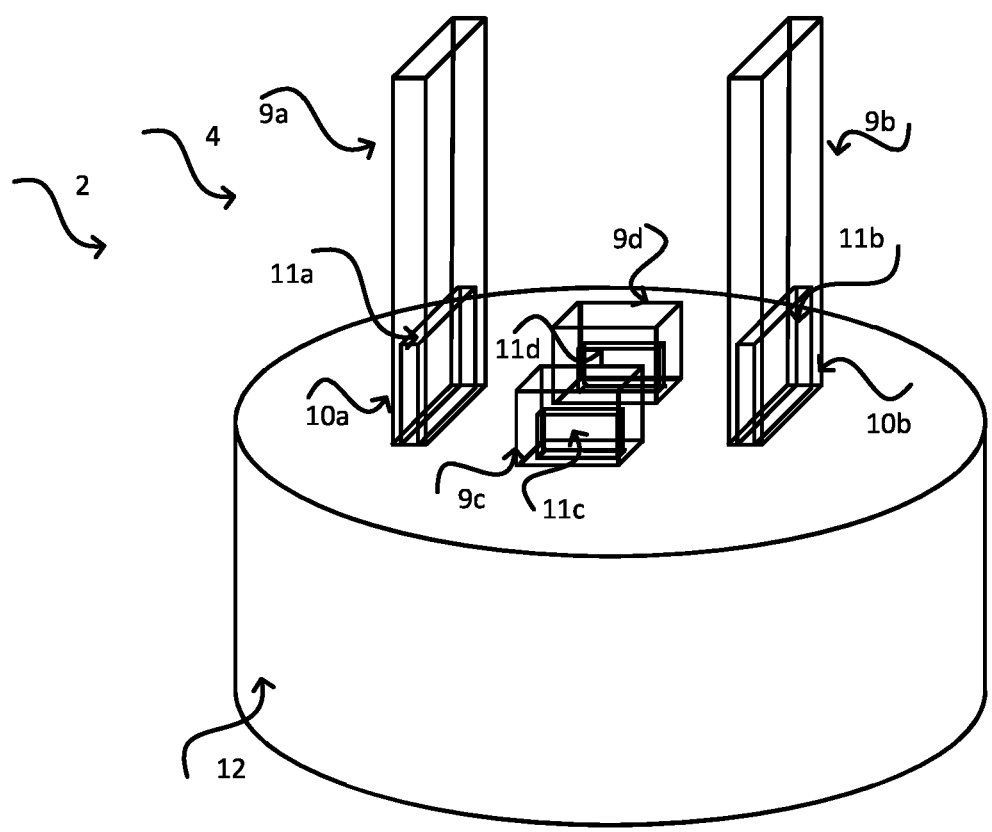

Another embodiment of the device 1 is shown in FIG. 2d. This device is based on the embodiment of FIG. 2b and includes a third 9c and a fourth oscillatory element 9d. These do not serve, however, for oscillation production. Rather, a third 11c and a fourth piezoelectric element 11d are arranged in the additional elements 9c, 9d, respectively. In such case, vibronic measuring is performed by means of the first two piezoelectric elements 11a, 11b and ultrasonic measuring is performed by means of the other two piezoelectric elements 11c,11d. Also in this case, for each measuring principle, one of piezoelectric elements, e.g. 11b and 11d, can be omitted. For reasons of symmetry, it is, however, advantageous, always to use two additional oscillatory elements 9c, 9d.

The first $R_E$ and second received signal $R_S$ result from different measuring methods and can be evaluated independently of one another as regards at least one process variable P. In this regard, reference is made to German patent application No. 102018127526.9, which was unpublished as of the earliest filing date of this application and to which comprehensive reference is taken in the context of the present invention.

Figure 3:
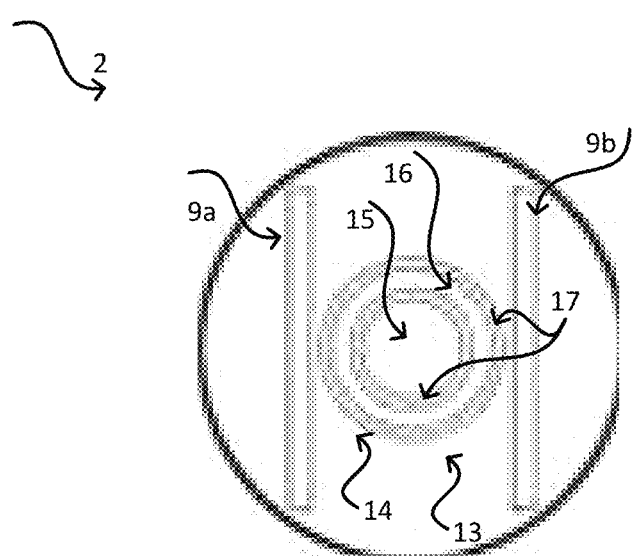
FIG. 3 shows an embodiment of a device of the present disclosure.

Moreover, according to the invention, the conductivity $\sigma$ and/or capacitance C of the medium can be determined and/or monitored. For this, the device of the invention has a conductivity/capacitance detecting unit 13 for determining and/or monitoring the conductivity $\sigma$ and/or capacitance C having a capacitive and/or conductive measuring probe 14, such as shown in FIG. 3. FIG. 3 shows a sensor unit 2 analogous to the embodiment of FIG. 2a. Arranged between the two oscillatory elements 9a and 9b of the oscillatable unit 4 embodied in the form of an oscillatory fork is the conductivity/capacitance detecting unit 13 for determining and/or monitoring the conductivity $\sigma$ and/or capacitor C of the medium M and having the capacitively and conductively working measuring probe 14, which has a sensor electrode 15 and a guard electrode 16 coaxially surrounding the sensor electrode 15. Arranged between the two electrodes 15 and 16 and between the measuring probe 14 and the mechanically oscillatable unit 4 in each case are insulating layers 17.

The invention claimed is:

1. A device for determining and/or monitoring at least one process variable of a medium, the device comprising:
    a sensor unit comprising:
        a mechanically oscillatable unit, which includes an oscillatory fork with a first oscillatory element and a second oscillatory element;
        a first piezoelectric element and a second piezoelectric element,
        wherein the first piezoelectric element is disposed, at least partially, in the first oscillatory element, and the second piezoelectric element is disposed, at least partially, in the second oscillatory element;
        a conductivity/capacitance detection unit adapted to determine and/or monitor a conductivity and/or capacitance of the medium,
        wherein the first piezoelectric element and the second piezoelectric element are configured to excite the mechanically oscillatable unit using an excitation signal such that mechanical oscillations are executed, to detect the mechanical oscillations of the oscillatable unit, and to convert the mechanical oscillations into a first received signal,
        wherein the first piezoelectric element is adapted to transmit a transmitted signal, which is an ultrasonic signal, and wherein the second piezoelectric element is adapted to receive the transmitted signal as a second received signal; and an electronics unit configured to determine, based on the first received signal and/or the second received signal, the at least one process variable and, based on a third received signal from the conductivity/capacitance detection unit, to determine the conductivity and/or capacitance of the medium.

2. The device of claim 1, wherein the conductivity/capacitance detecting unit for determining and/or monitoring the conductivity and/or capacitance of the medium comprises a capacitive and/or conductive measuring probe including at least one probe electrode.

3. The device of claim 2, wherein the measuring probe includes a guard electrode.

4. The device of claim 1, wherein the sensor unit further comprises a device configured to determine and/or monitor a pressure of the medium and/or a device configured to determine and/or monitor a temperature of the medium.

5. The method of claim 1, wherein the electronics unit is configured to determine a first process variable based on the first received signal and to determine a second process variable based on the second received signal.

6. The device of claim 1, wherein the at least one process variable is a fill level, a density, a viscosity, a velocity of sound or a variable derived from at least one of the foregoing process variables.

* * * * *